(12) United States Patent
Radich et al.

(10) Patent No.: US 11,949,435 B2
(45) Date of Patent: Apr. 2, 2024

(54) MARKOV ENCODER-DECODER OPTIMIZED FOR CYCLO-STATIONARY COMMUNICATIONS CHANNEL OR STORAGE MEDIA

(71) Applicant: Seagate Technology LLC, Fremont, CA (US)

(72) Inventors: William M. Radich, Berthoud, CO (US); Raman Venkataramani, Longmont, CO (US); Jason Bellorado, San Jose, CA (US); Marcus Marrow, Santa Clara, CA (US); Zheng Wang, Louisville, CO (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 17/475,552

(22) Filed: Sep. 15, 2021

(65) Prior Publication Data

US 2023/0105010 A1    Apr. 6, 2023

(51) Int. Cl.
*H03M 13/00*   (2006.01)
*G06N 7/01*    (2023.01)
*H03M 13/01*   (2006.01)
*H03M 13/39*   (2006.01)
*H03M 13/41*   (2006.01)
*H03M 13/45*   (2006.01)

(52) U.S. Cl.
CPC .......... *H03M 13/4138* (2013.01); *G06N 7/01* (2023.01); *H03M 13/01* (2013.01); *H03M 13/3961* (2013.01); *H03M 13/45* (2013.01)

(58) Field of Classification Search
CPC ............ H03M 13/4138; H03M 13/01; H03M 13/3961; H03M 13/45; G06N 7/005
USPC .................................................. 714/746, 759
See application file for complete search history.

(56) References Cited

U.S. PATENT DOCUMENTS

| 7,173,972 B2* | 2/2007 | Thomson ............... H03M 13/41 714/795 |
| 8,570,879 B2 | 10/2013 | Marrow et al. |
| 8,737,002 B1* | 5/2014 | Dhanda ................... G11B 5/746 360/48 |
| 8,824,084 B1* | 9/2014 | Gurney ................... G11B 5/746 428/836 |
| 8,976,474 B1* | 3/2015 | Wang ................... G11B 20/1403 341/50 |
| 9,203,429 B1* | 12/2015 | Chaichanavong .......................... H03M 13/6325 |
| 10,447,315 B2 | 10/2019 | Venkataramani |
| 10,453,489 B1 | 10/2019 | Lee et al. |
| 10,950,268 B1 | 3/2021 | Chang et al. |
| 2003/0085831 A1* | 5/2003 | Lavoie .................... G01S 7/021 342/13 |

(Continued)

*Primary Examiner* — Shelly A Chase
*Assistant Examiner* — Osman M Alshack
(74) *Attorney, Agent, or Firm* — Mueting Raasch Group

(57) ABSTRACT

A cyclo-stationary characteristic of a communications channel and/or storage media is determined. The cyclo-stationary characteristic has K-cycles, K>1. Markov transition probabilities are determined that depend on a discrete phase ϕ=t mod K, wherein t is a discrete time value. An encoder to optimize the Markov transition probabilities for encoding data sent through the communications channel and/or stored on the storage media. The optimized Markov transition probabilities are used to decode the data from the communication channel and/or read from the storage media.

20 Claims, 6 Drawing Sheets

(56) References Cited

U.S. PATENT DOCUMENTS

| | | | |
|---|---|---|---|
| 2008/0123210 A1* | 5/2008 | Zeng | H03M 13/6331 360/51 |
| 2009/0059430 A1* | 3/2009 | Dobisz | G11B 5/855 360/137 |
| 2010/0205234 A1* | 8/2010 | Lim | H04L 27/0006 708/620 |
| 2011/0075569 A1* | 3/2011 | Marrow | H04L 43/00 370/242 |
| 2011/0222584 A1* | 9/2011 | Michaels | H04J 13/0018 375/130 |
| 2011/0286125 A1* | 11/2011 | Lille | G11B 5/746 |
| 2013/0083420 A1* | 4/2013 | Albrecht | G11B 5/59688 |
| 2014/0106801 A1 | 4/2014 | Tamizhmani et al. | |
| 2016/0142175 A1* | 5/2016 | Waheed | H04L 1/0015 370/329 |
| 2019/0058494 A1* | 2/2019 | Venkataramani | H04L 25/067 |

\* cited by examiner

MARKOV ENCODER-DECODER OPTIMIZED FOR CYCLO-STATIONARY COMMUNICATIONS CHANNEL OR STORAGE MEDIA

SUMMARY

The present disclosure is directed to a Markov encoder-decoder optimized for a cyclo-stationary communications channel or storage media. In one embodiment, a method determining a cyclo-stationary characteristic of a communications channel, the cyclo-stationary characteristic having K-cycles, K>1. Markov transition probabilities are defined that depend on a discrete phase $\phi=t$ mod K, wherein t is a discrete time value. An encoder is trained to optimize the Markov transition probabilities for encoding data sent through the communications channel, and the optimized Markov transition probabilities are used to decode the data from the communication channel.

In another embodiment, a method involves determining a cyclo-stationary characteristic of a storage media, the cyclo-stationary characteristic having K-cycles, K>1. Markov transition probabilities are defined that depend on a discrete phase $\phi=t$ mod K, wherein t is a discrete time value. An encoder is trained to optimize the Markov transition probabilities for encoding data sent for storage on the storage media, and the optimized Markov transition probabilities are used to decode the data retrieved from the storage media.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

DETAILED DESCRIPTION

The present disclosure is generally related to data storage devices such as hard disk drives (HDDs). These drives store data by applying a changing magnetic field from a recording head to the surface of a magnetic disk that is moving relative to the head. A recording head generally includes a read transducer, e.g., magnetoresistive (MR) sensors that can read back the recorded data by translating the changing magnetic fields to analog electrical signals. The analog electrical signals are processed and conditioned, converted to digital data, and decoded to recover the stored data, which can then be sent to a requestor, e.g., a host computer, an internal controller, etc.

While HDDs have been supplanted in some applications (e.g., personal computers) by solid-state storage, there is continued high demand for devices that lower cost per unit of storage in other applications such as data centers, backup, etc. As such, the areal density capacity (ADC) of HDDs will need to continue to increase in order to satisfy this demand. For example, average HDD capacity was about 1 TB in 2015 and has now reached about 5.5 TB in 2021. In order to continue this trend, new technologies will need to be developed.

Currently, heat-assisted magnetic recording (HAMR) drives have been fielded with an excess of 20 TB capacity and are forecasted to achieve 40 TB or higher by 2023. Other technologies may be used together with HAMR to achieve these capacities, such as shingled magnetic recording (SMR) and two-dimensional magnetic recording (TDMR). Another technology that may be used to continue this trend is referred to as patterned media.

Conventional recording media used in hard disk drives include a disk substrate that is coated with a number of (mostly non-magnetic) layers covered with a magnetic media layer and hard overcoat. The magnetic media layer is divided into small sub-micrometer-sized magnetic regions, referred to as grains, each of which may have a different magnetic orientation. During formation of the magnetic layer, the grains naturally arrange themselves into a random pattern on the disk surface. Patterned media approaches generally involve using nanolithography to pattern grain structures on the media.

Patterned media approaches for magnetic recording are of interest for future high-density data storage systems, as they help alleviate the superparamagnetic limit by increasing effective grain volume. A particular approach, referred to as Grain-Patterned Media (GPM), constrains the growth of magnetic grains in the down-track direction via the use of radially-patterned boundaries that are fabricated into the media during manufacture; see, e.g., U.S. Pat. No. 10,950,268 to Chang et al. One benefit of such a recording process is that media/transition noise will be greatly reduced at the pattern transition boundaries when compared to conventional, continuous media.

Figure 1:
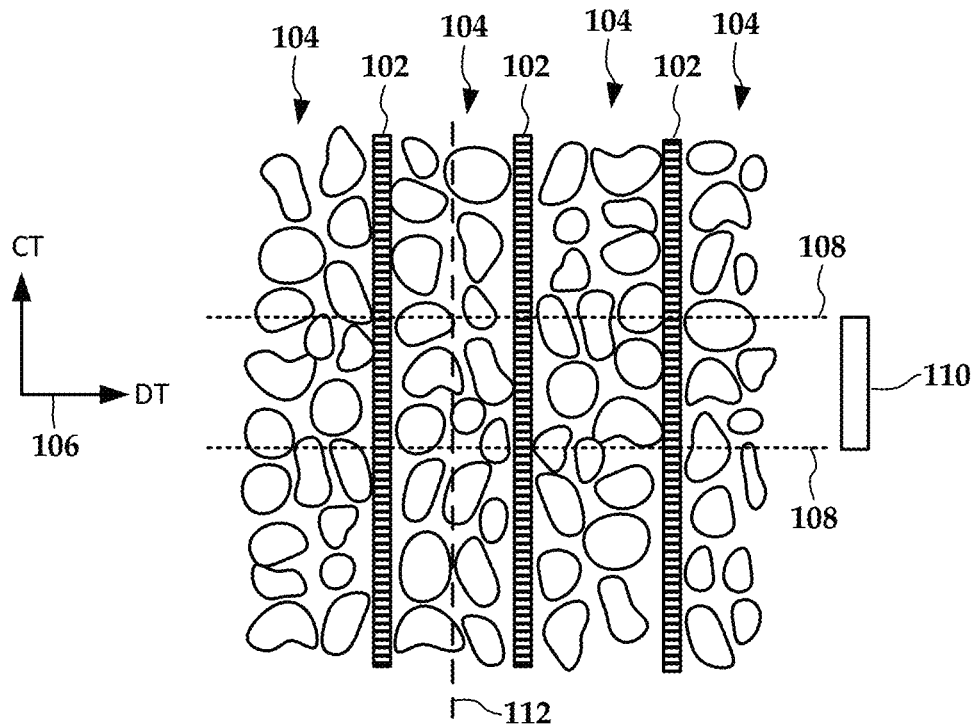
FIG. 1 is a diagram of a grain patterned media used in a data storage device according to an example embodiment.

In FIG. 1, a diagram shows an example of a grain patterned media. A series of radial transition boundaries 102 are patterned onto a media. Grains 104 are grown between the transition boundaries 102. Arrow 106 indicates downtrack (DT) and crosstrack (CT) directions of the disk. Lines 108 represent the boundaries of a track that is traversed by a head element 110, e.g., reader or writer.

This disclosure relates to GPM configurations that have two or more grain rows within the pattern transition boundaries 102. The example shown in FIG. 1 has two grain rows between each boundary 102, as indicated by intergranular transition boundary 112. In such a case, the intergranular written bit transitions 112 exhibit higher media noise than those bit transitions separated by the patterned transition boundary 102. One implication of this observation is that two written data sequences that are identical, except for their respective phases (e.g., [0 0 1 1 0 0 1 1] vs. [0 1 1 0 0 1 1 0]), can exhibit distinct noise statistics, and therefore disparate data detection performance.

This disclosure proposes ways to accommodate the phase-dependent noise statistics of GPM and optimally enable areal-density gain with this new recording technology. One of these methods is a time varying Markov/modulation code that reduces the probability of written transitions at intergranular boundaries. Note that there are two aspects relating to the new time varying Markov code design: generation of the Markov source probabilities, and b) a modified Markov encoder/decoder (ENDEC). Another method is a time varying soft-input, soft-output, data-dependent Viterbi detection (SOVA) that incorporates the time-varying Markov ENDEC properties as well as the specific transition noise statistics resulting from GPM in its branch metric. Note that for purposes of this disclosure the terms detection/decoding, detector/decoder, etc. are used interchangeably, as both related to determining a most likely data sequence (e.g., codeword) from a set of transmitted signals, wherein the signals were previously encoded with a known encoding scheme at one end of a communications channel.

A Markov model generally relates to modeling state changes in a system based on the current state and a set of state transition probabilities. In U.S. Pat. No. 8,976,474 (Universal Modulation Coding For A Data Channel, by Wang et al.), a method is disclosed for receiving a user data sequence, and encoding it into a coded sequence that conforms to a set of input/desired Markov transition probabilities. This patent also describes the method for decoding a received Markov-encoded sequence back into user data. Typically, these transition probabilities effectively mitigate local written encoded patterns that are more prone to detection errors by assigning them a lower probability. Correspondingly, the Markov encoding process writes such low-confidence patterns less frequently.

A related patent, U.S. Pat. No. 10,447,315 (Channel Error Rate Optimization Using Markov Codes, by Venkataramani, which is hereby incorporated by reference in its entirety) details a method to obtain/train such Markov probabilities in a code-rate efficient manner, based on either a real or simulated magnetic recording channel. Although both patents are applicable for a wide range of recording and even data-communication channels, neither of the described methods can be used directly for two or more grain-per-row media designs, because of the time-dependent, cyclo-stationary, statistical nature of GPM described above.

Figure 2:
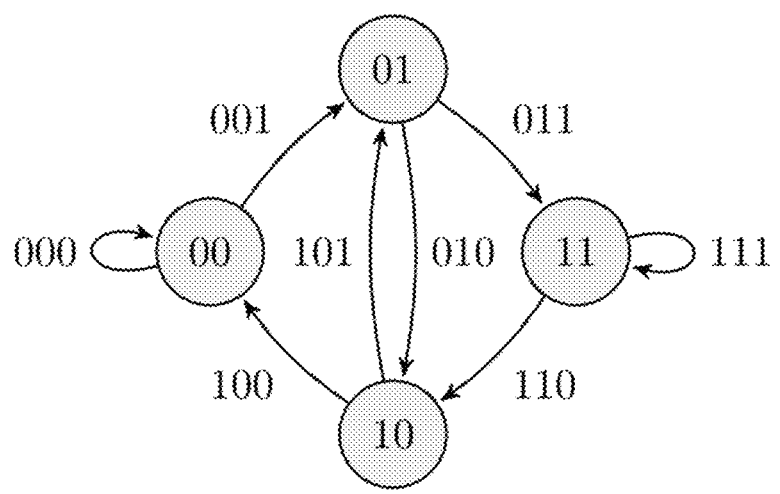
FIGS. 2 and 3 are graphs showing Markov state transitions that can be used to encode and decode data according to an embodiment.

In FIG. 2, block diagram illustrates concepts related to time-invariant read channel finite state descriptions. In embodiments described herein, media data is represented as a collection/sequence of finite-states, which allows the use of inter-symbol interference (ISI) channel detection and Markov source probabilistic descriptions to model the data channel. If the encoded/media bits to be estimated are represented as the sequence $x_t$, then due to the effects of ISI, modulation code constraints, and noise properties, the data sequence detection problem can be formalized as one that tracks the most probable state sequence based on a received, noisy, sequence y t on a trellis.

We begin with a description of an example detector with memory M. The detector is based on a hidden Markov model (HMM) with $2^M$ states that are labeled by all M-bit patterns for some "memory" parameter M. Specifically, the HMI state is at time t is $S_t = x_{t-M+1}^t$ where $\{x_t\}$ is the sequence of input bits. For example, $S_t = (x_{t-1}, x_t)$, could define the states in a simple, binary, 4-state detector, and a transition between states, $S_t$ and $S_{t+1}$ would uniquely identify the 3-bit pattern given by $E_t = (x_{t-1}, x_t, x_{t+1})$. The state diagram for this simple example is illustrated in FIG. 2. The four states are labeled 00, 01, 10 and 11 and the eight edges that connect the states (the state transitions) are labeled by 3-bit patterns.

Figure 3:
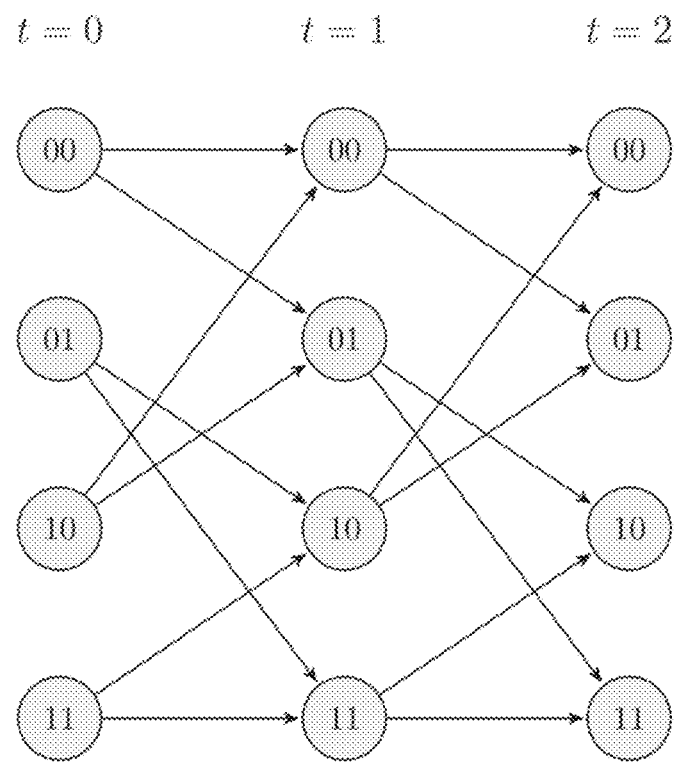

The corresponding trellis diagram, representing a standard, stationary (non-time-varying) trellis, is shown in FIG. 3. Note also that the diagram in FIG. 3 explicitly shows the time direction by unrolling the time component of the HMI in FIG. 2. The SOVA and Markov training model parameters are used in a time-invariant fashion for all times t. The existing methods for training the SOVA and information-rate or BER-based Markov models (e.g., as described in U.S. Pat. No. 10,447,315) assume time-invariance or stationarity.

For the sake of completeness, some of the details of a stationary model are described further. Let $S_t = x_{t-M+1}^t$ denote a M-bit state in the trellis at time t and $E_t = (S_{t-1}, S_t) \equiv x_{t-M}^t$ denotes the (M+1)-bit an incoming edge in the trellis at state $S_t$. A Markov model specifies on a prior conditional probability $P(S_t|S_{t-1})$ on an edge $E_t$. In the trellis structure, this is equivalent to the probability of the newest bit given the most recent M bits: $P(x_t|x_{t-M}^{t-1})$. As such, the Markov model can be stored in a look-up table (LUT) of size $2^{M+1}$ with one entry for each edge in the trellis.

Figure 4:
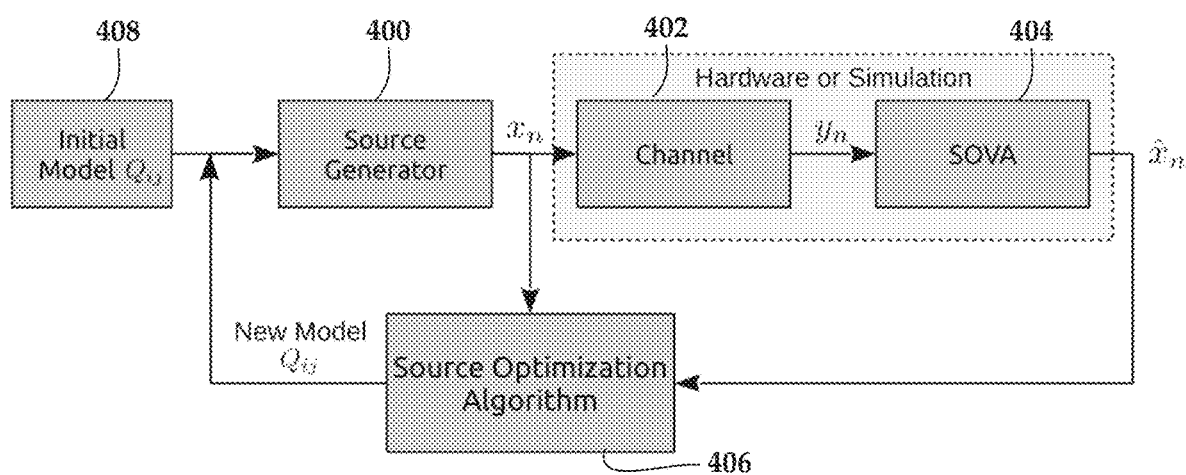
FIG. 4 is a block diagram of an iterative training algorithm for and encoder/decoder according to an example embodiment.

In various embodiments, these probabilities can be chosen to minimize the frequency of "problematic" edges, usually bit-patterns that contain many transitions and are affected by high amounts of transition jitter noise. A quantitative metric such as the information rate or the bit error rate (BER) can be used to optimize the Markov models using an iterative algorithm as illustrated in FIG. 4. The algorithm begins by using an initial Markov source which is either an independent and identically distributed (IID) distribution or another good starting point. The quantity $Q_{ij}$, represents the probabilities of starting from the detector trellis states i and going to states j and fully describes the Markov source model. The source generator block 400 maps random data to sequences with the desired Markov properties of the current model, which is the initial model 408 for the first iteration. In practice, a special encoder/decoder (ENDEC) unit can be used to perform this mapping and this unit will be discussed below. The encoded bits are sent through the channel 402 and SOVA detector 404 and the output $\hat{x}_n$ is fed to the source optimization unit 406 that estimates a new (and hopefully better) Markov model $Q_{ij}$ for the next iteration. The entire process is repeated a few times until the Markov probabilities converge. This model is considered stationary in the sense that the same Markov LUT is reused for all time instances The SOVA detector uses a trellis branch metric function $B_t(e)$ defined for each edge $E_t = e$ in the trellis. For example, the least-squares data-dependent noise predictive (DDNP)-type branch metric function takes the form in Equation (1), where $z_t$ is the equalized sample sequence. The edge-dependent detector model parameters $w_e[\cdot]$ (finite impulse response filters), $\mu_e$ and $\sigma_e^2$ (scalars) are chosen to minimize the residual prediction error variance over the space of parameters as shown in Equation (2).

$$B_t(e) = \frac{1}{2\sigma_e^2}\left(\sum_{l=0}^{L} w_e[l]z_{t-l} - \mu_e\right)^2 + \frac{1}{2}\log\sigma_e^2 \quad (1)$$

$$\sigma_e^2 = \min_{w_e, \mu_e} E\left(\left(\sum_{l=0}^{L} w_e[l]z_{t-l} - \mu_e\right)^2 \bigg| E_t = e\right) \quad (2)$$

There are several other ways to train these detector models. For example, the min-BER approach (see, e.g., U.S. Pat. No. 8,570,879 B2, to Marrow, et al.) minimizes the resulting BER metric directly, using an adaptive algorithm. However, these existing methods are also inherently stationary, because there is no explicit time dependence of the model parameters. The following sections show how to adapt these models to a system with cyclo-stationary behavior, including the system with K grains per row, with the case of K=2 being used for illustration.

As an example, consider the system with two grains per row where the signal and noise statistics are expected to have time-varying nature, specifically, cyclo-stationary with period 2. For such a model, the SOVA and Markov model parameters can be set to depend on the quantity φ=t mod 2 (where "mod" is the modulo operator, which returns the remainder of an integer division) which can be referred to as the "discrete phase." In other words, the system uses separate models when t is even and odd. More generally with K grains per row, the model is expected to cycle through K different set of models for each possible value of the discrete phase. In concrete terms, the model parameters depend on the time index through the discrete phase φ=t mod K. For example, the Markov model takes the form $P_\phi(x_t|x_{t-M}^{t-1})$ and the SOVA model parameters are $w_{e,\phi}$, $\mu_{e,\phi}$, $c_{e,\phi}$.

Figure 5:
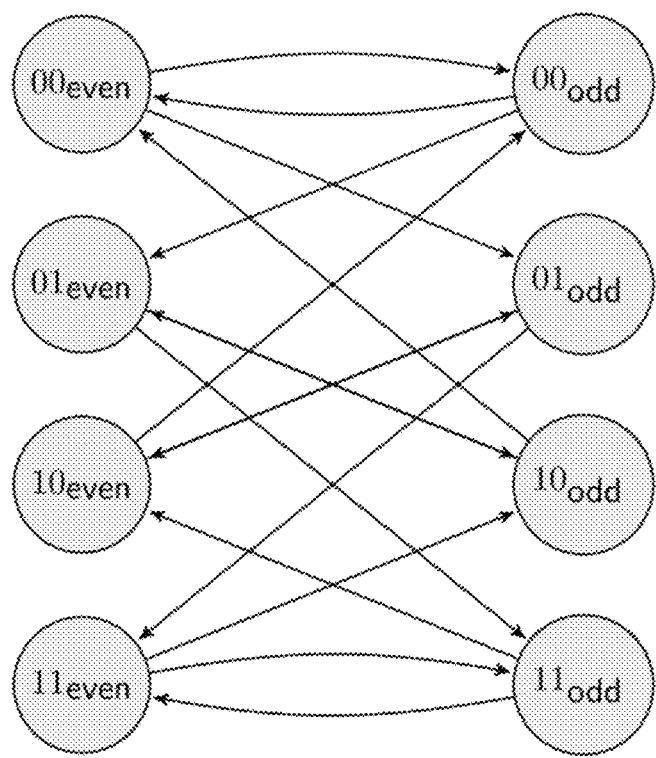
FIGS. 5 and 6 are graphs showing Markov state transitions that can be used to encode and decode data according to another example embodiment.

To simplify the discussion, take as an example the specific two-bit memory HMM in FIG. 2 with period K=2. One method to introduce cyclostationarity into this model is by using two sets of states labeled "even" and "odd" respectively. The result is a bipartite graph as illustrated in FIG. 5, which is an eight state bipartite HMM, e.g., for two row GPM. If the system starts at any of the even states at time t=0, we can ensure that we visit only even states for even value of t and odd states for odd values of t. Note that the arrangement of data on the disk (e.g., predetermined spacing of data sector relative to servo marks) can ensure data sectors start at a predetermined state, e.g., even or odd.

Figure 6:
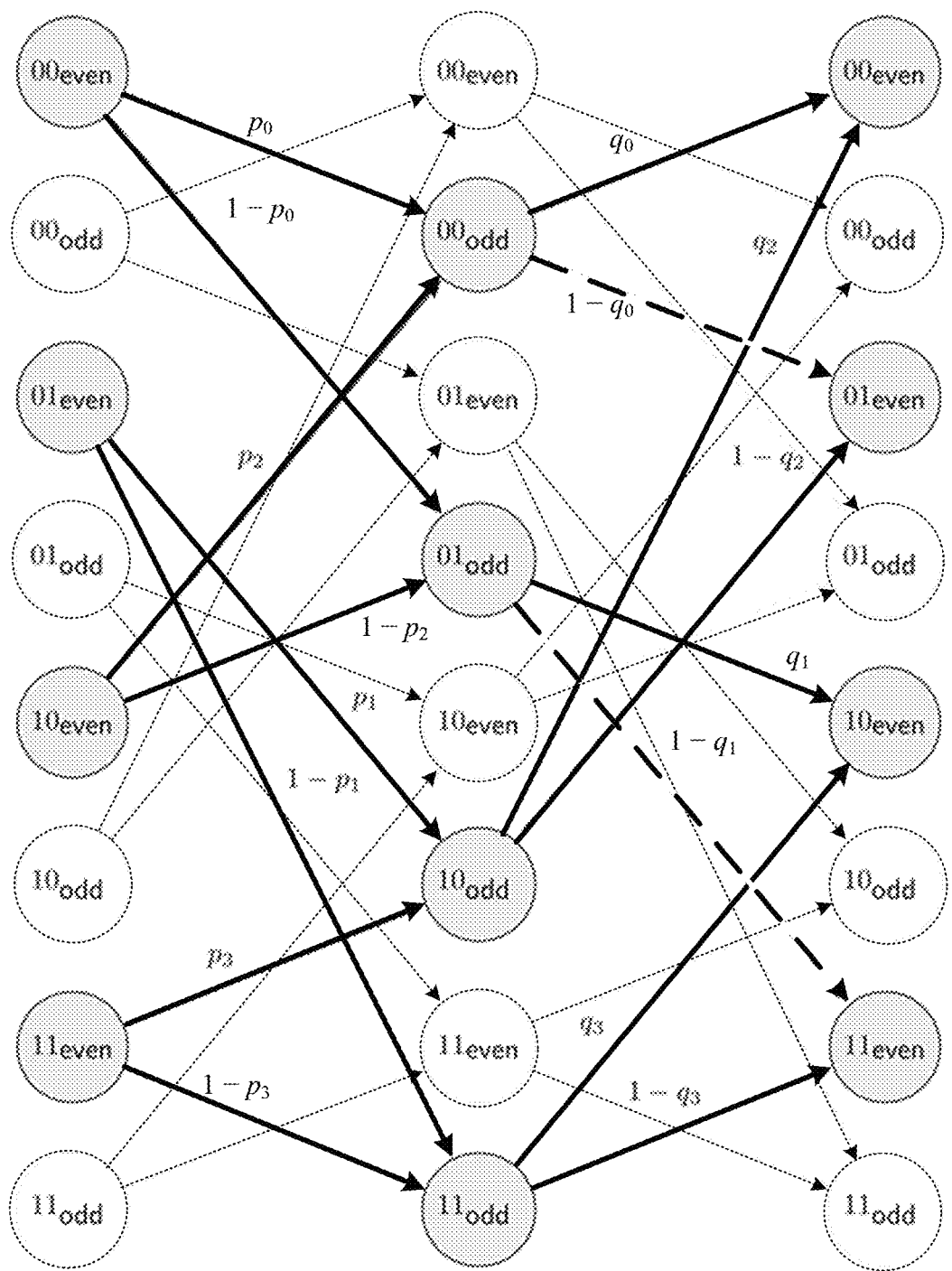

Unrolling the time component of the state diagram in FIG. 5 results in the trellis structure shown in FIG. 6. Compared to FIG. 3, there are twice as many states and edges per trellis segment, but the edges represented by dotted lines are never traversed, and some states (those drawn in thin, dotted lines) are never visited. Indeed, if one starts at an even state at t=0, the only allowed paths are the ones shown as thicker, solid and dashed lines. However, this description can be cast as a time-invariant trellis and SOVA/Markov model parameters can meaningfully be assigned to all edges. All the existing algorithms for SOVA and Markov model training can then be applied to this modified trellis structure. By choice of the initial state being even, the even model will never be trained or used at an odd initial time or vice versa. The transition probabilities on branches are denoted by $p_i$, $q_i$, i={0,1,2,3}.

In the most general case of K grains per row, the system can be viewed as having a cyclo-stationary signal and noise statistics with period K. An HMM can be constructed with K copies of all states. For every state S in the original HMI, states labeled (S, φ) are created for an integer 0≤φ<K in the new HMM. Furthermore, for an edge S→T in the original HMM, edges (S, φ)→(T, (φ+1) mod K) exist for 0≤φ<K. This represents a K-fold increase in the number of states and edges. As usual, it is possible to enforce that initial state at t=0 is one of the states (S, 0), thereby reducing the total number of state transitions in the final trellis.

Figure 7:
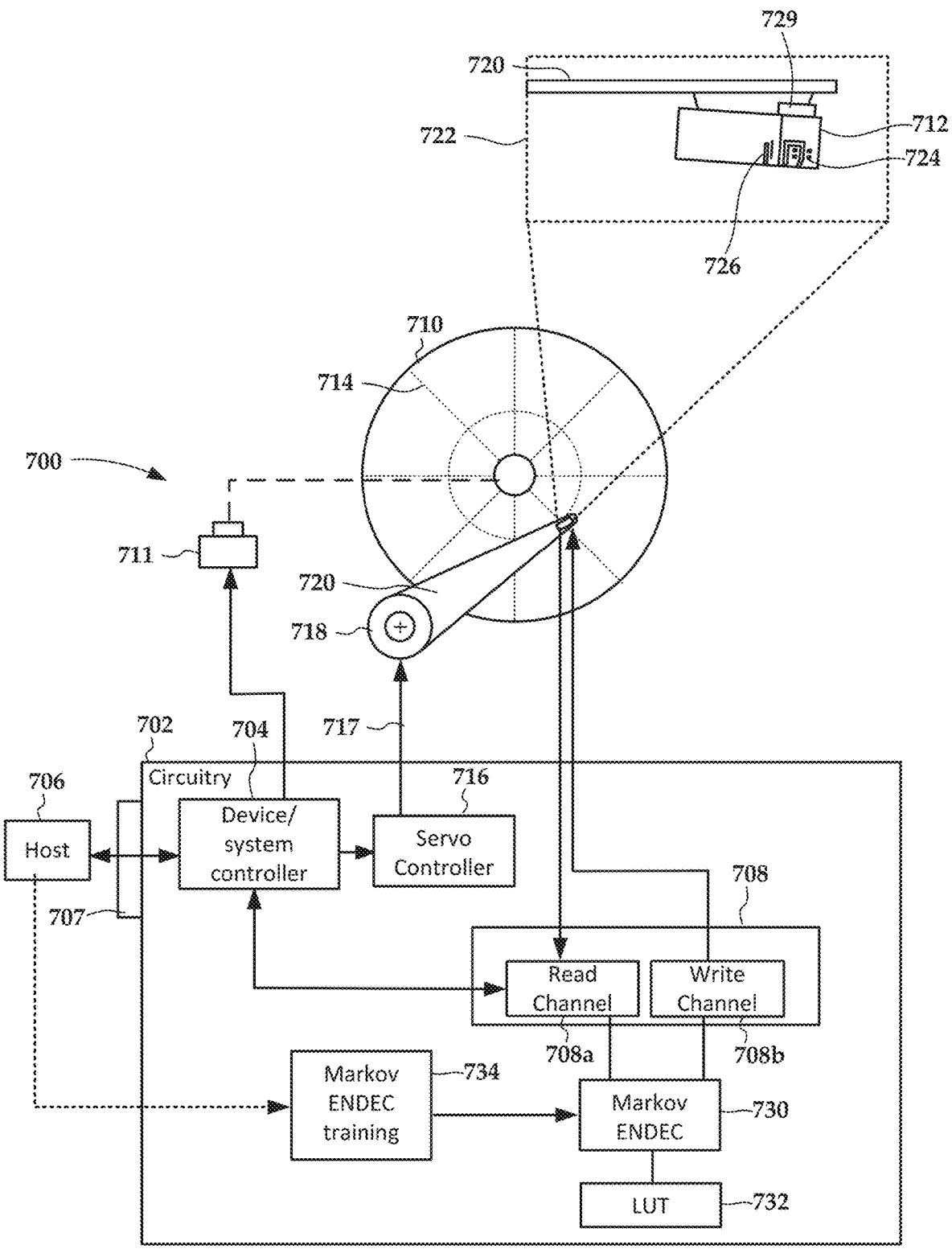
FIG. 7 is a diagram of a hard disk apparatus according to an example embodiment.

The Markov model is a probabilistic model for a bit $x_t$ based only on a short block of recent bits (the "memory"): $S_{t-1}=(x_{t-M}, x_{t-1})$. This is written as $P(x_t|S_{t-1})$. The conventional Markov ENDEC is also designed to only work for a stationary Markov model. As shown in FIG. 7, the Markov ENDEC 730 takes probabilities $P(x_t|S_{t-1})$ as input to guide the encoding/decoding process. With a stationary Markov model where M=2, an example of a probability table is shown in Table 1. Note that the probabilities would be specific to a particular drive, and possibly to different heads within each drive.

TABLE 1

Static Markov transition probabilities with M = 2

| $S_{t-1}$ | $Pr(x_t = 1| S_{t-1})$ | $Pr(x_t = 0| S_{t-1})$ |
|---|---|---|
| 00 | 0.58 | 0.42 |
| 01 | 0.44 | 0.56 |
| 10 | 0.43 | 0.57 |
| 11 | 0.59 | 0.41 |

With the two-grain-per-row case where K=2, there are two Markov models $P_{even}(x_t|S_{t-1})$ and $P_{odd}(x_t|S_{t-1})$ depending on whether t is even or odd. The number of states in Table 1 is doubled in order to incorporate this dependency on time, as shown in Table 2. The probabilities $p_i$, $q_i$, i={0,1,2,3} are defined in FIG. 6.

TABLE 2

Markov transition probabilities for two-grain-per-row media, with K = 2

| $S_{t-1}$ | $Pr(x_t = 1| S_{t-1})$ | $Pr(x_t = 0| S_{t-1})$ |
|---|---|---|
| 00, even | 1-$p_0$ | $p_0$ |
| 00, odd | 1-$q_0$ | $q_0$ |
| 01, even | 1-$p_1$ | $p_1$ |
| 01, odd | 1-$q_1$ | $q_1$ |
| 10, even | 1-$p_2$ | $p_2$ |
| 10, odd | 1-$q_2$ | $q_2$ |
| 11, even | 1-$p_3$ | $p_3$ |
| 11, odd | 1-$q_3$ | $q_3$ |

In some implementations, the Markov ENDEC processes the bits block-by-block with a block size of B-bits. In these implementations, the block transition probabilities are computed over a block of B-bits at times t=mB for integer values of m: as shown in Equation (3) below.

$$(x_t^{t+B-1}|S_{t-1}) = \Pi_{b=0}^{B-1} P(x_{t+b}|S_{t-1+b}) \qquad (3)$$

Table 3 shows an example of the transition probabilities $P(S_{t+1}|S_{t-1})$ when B=2, such that the right side of Equation (3) reduces to $P(x_t|S_{t-1})*P(x_{t+1}|S_t)$. Note that when B is even (or more generally an integer multiple of K), then t is also even (or an integer multiple of K) so that the probabilities do not change for different values of t. In other words, the transition probabilities only need to be programmed with the correct values regardless of whether the underlying Markov model is stationary or not, and without needing to increase the number of Markov states. As shown in Table 3, half of the rows and columns are redundant with probabilities of 0. Therefore, Table 3 could be trimmed to contain only half of the states as shown in Table 4.

TABLE 3

Block Markov transition probabilities $P(S_{t+1}|S_{t-1})$ for B = 2

| $S_{t-1}$ | $S_{t+1}$ | | | | | | | |
|---|---|---|---|---|---|---|---|---|
| | 00,even | 00,odd | 01,even | 01,odd | 10,even | 10,odd | 11,even | 11,odd |
| 00,even | $p_0 q_0$ | 0 | $p_0(1-q_0)$ | 0 | $(1-p_0)q_0$ | 0 | $(1-p_0)(1-q_0)$ | 0 |
| 00,odd  | 0 | 0 | 0 | 0 | 0 | 0 | 0 | 0 |
| 01,even | $p_1 q_2$ | 0 | $p_1(1-q_2)$ | 0 | $(1-p_1)q_2$ | 0 | $(1-p_1)(1-q_3)$ | 0 |
| 01,odd  | 0 | 0 | 0 | 0 | 0 | 0 | 0 | 0 |
| 10,even | $p_2 q_0$ | 0 | $p_2(1-q_0)$ | 0 | $(1-p_2)q_0$ | 0 | $(1-p_2)(1-q_0)$ | 0 |
| 10,odd  | 0 | 0 | 0 | 0 | 0 | 0 | 0 | 0 |
| 11,even | $p_3 q_2$ | 0 | $p_3(1-q_2)$ | 0 | $(1-p_3)q_2$ | 0 | $(1-p_3)(1-q_2)$ | 0 |
| 11,odd  | 0 | 0 | 0 | 0 | 0 | 0 | 0 | 0 |

TABLE 4

Trimmed block Markov transition probabilities $P(S_{t+1}|S_{t-1})$ for B = 2

| $S_{t-1}$ | $S_{t+1}$ | | | |
|---|---|---|---|---|
| | 00, even | 01, even | 10, even | 11, even |
| 00, even | $p_0 q_0$ | $p_0(1-q_0)$ | $(1-p_0)q_0$ | $(1-p_0)(1-q_0)$ |
| 01, even | $p_1 q_2$ | $p_1(1-q_2)$ | $(1-p_1)q_2$ | $(1-p_1)(1-q_3)$ |
| 10, even | $p_2 q_0$ | $p_2(1-q_0)$ | $(1-p_2)q_0$ | $(1-p_2)(1-q_0)$ |
| 11, even | $p_3 q_2$ | $p_3(1-q_2)$ | $(1-p_3)q_2$ | $(1-p_3)(1-q_2)$ |

The most general case is where B need not be divisible by K (and that includes B=1 as shown in Table 2). This can be solved by introducing the extra states to keep track of the discrete phase $\phi = t \bmod K$ as described in the previous section. Since the time index t is a multiple of B: t=mB for some integer m, there are only K/d possible remainders when t is divided by K where d=gcd(K, B) (gcd stands for greatest common denominator). A simple argument reveals that only a (K/d)-fold increase is needed in the number of Markov ENDEC states to implement this idea. To illustrate with a simple example, suppose there are K=6 grains per row and the ENDEC block size is B=4. Then d=gcd(6,4)=2 and K/d=6/2=3. Therefore, there are only 3 discrete phase values for t=mB modulo K that we can encounter, namely 0, 2 and 4: {4m mod 6: m=0,1,2,3,4,5, . . . }={0,4,2}.

The Markov ENDEC described above can be implemented in any system that exhibits predetermined cyclostationary behavior, such as GPM recording, wireless communications, etc. An example of the former is shown in FIG. 7, which is a block diagram of a data storage apparatus 700 (e.g., HDD) according to an example embodiment. The apparatus 700 includes circuitry 702 such as one or more device/system controllers 704 that process read and write commands and associated data from a host device 706 via a host interface 707. The host interface 707 includes circuitry that enables electronic communications via standard bus protocols (e.g., SATA, SAS, PCI, NVMe, etc.). The host device 706 may include any electronic device that can be communicatively coupled to store and retrieve data from a data storage device, e.g., a computer, a server, a storage controller. The system controller 704 is coupled to one or more read/write channels 708 (shown here as separate read channel 708a and write channel 708b) that read from and write to a recording media, which in this figure are surfaces of one or more magnetic disks 710 that are rotated by a spindle motor 711.

The disks 710 may include grain patterned media with K-grain rows of the grain-patterned media separated by pattern transition boundaries, where K>1. This arrangement of K-rows separated by transition boundaries is repeated over some or all of the disks 710. Note that the disks 710 may include two or more zones that have different values of K, and the procedures above can be adapted accordingly, e.g., using different Markov ENDEC lookup tables for the different zones.

The read/write channels 708 generally convert data between the digital signals processed by the device controller 704 and the analog signals conducted through one or more heads 712 during read and write operations. As seen in detail view 722, each head 712 may include one or more read transducers 726 each capable of reading one surface of the disk 710. The head 712 may also include respective write transducers 724 that concurrently write to the disk 710. The write transducers 724 may be configured to write using an energy source (e.g., laser 729 for a HAMR device), and may write in various track configurations, such as conventional tracks, shingled magnetic recording (SMR), and interlaced magnetic recording (IMR).

The read/write channels 708 may utilize analog and digital circuitry such as digital-to-analog converters (DACs), analog-to-digital converters (ADCs), detectors, decoders, timing-recovery units, error correction units, etc., and some of this functionality may be implemented in code executable code on the digital circuitry. The read/write channels 708 are coupled to the heads 712 via interface circuitry that may include preamplifiers, filters, etc. A separate read channel 708a and write channel 708b are shown, although both may share some common hardware, e.g., digital signal processing chip.

In addition to processing user data, the read channel 708a reads servo data from servo marks 714 on the magnetic disk 710 via the read/write heads 712. The servo data are sent to one or more servo controllers 716 that use the data (e.g., frequency burst patterns and track/sector identifiers embedded in servo marks) to provide position control signals 717 to one or more actuators, as represented by voice coil motors (VCMs) 718. In response to the control signals 717, the VCM 718 rotates an arm 720 upon which the read/write heads 712 are mounted. The position control signals 717 may also be sent to microactuators (not shown) that individually control each of the heads 712, e.g., causing small displacements at each read/write head.

The read/channels 708 utilize a Markov ENDEC 730 for encoding of data stored to the disks 710 and detecting/decoding of data read from the disks 710. The Markov ENDEC 730 may be implemented as one or more subroutines that are part of the read/write channel firmware. The Markov ENDEC 730 may include two or more portions that perform the separate encoding/decoding functions, although may share some code libraries as well as sharing data such as LUT 732, which maps transition probabilities for data sequences written to and read from the disks 710, as well as the patterns to which the probabilities apply. The LUT 732 may also include some metadata describing the read/write stream (e.g., memory parameter M, block size B, cycle value K), although some of this data may be hard-coded into firmware.

A Markov ENDEC training module 734 is used to build up the data stored in the LUT 732. This can be performed in a factory process, and instructions of the training module 734 may be run one or both of the storage apparatus 700 or an external computer, as indicated by the dashed line between the training module 734 and host 706. The apparatus 700 may include multiple LUTs 732, e.g., having different values for different heads, disk zones, etc.

Details of the training process used by the ENDEC training module 734 are described in incorporated U.S. Pat. No. 10,447,315 noted above. Generally the training involves generating a training sequence as a Markov code, e.g., mapping random data to sequences having the transition probabilities of the Markov code. The procedure involves propagating the training sequence through the communication channel (e.g., read/write channel 708, heads 712, disks 710, etc.) and estimating, e.g., with a SOVA detector, data values of the training sequence after propagation through the communication channel. The estimated data values are compared to the generated training sequence to determine an error rate, e.g., BER, and the training sequence is changed as a different Markov code to lower the error rate of the data through the communication channel. The propagation, estimation, comparison, and changing of Markov codes can be performed over multiple iterations until a convergence criterion is satisfied. The final Markov code obtained from the process can be stored in the LUT 732.

Figure 8:
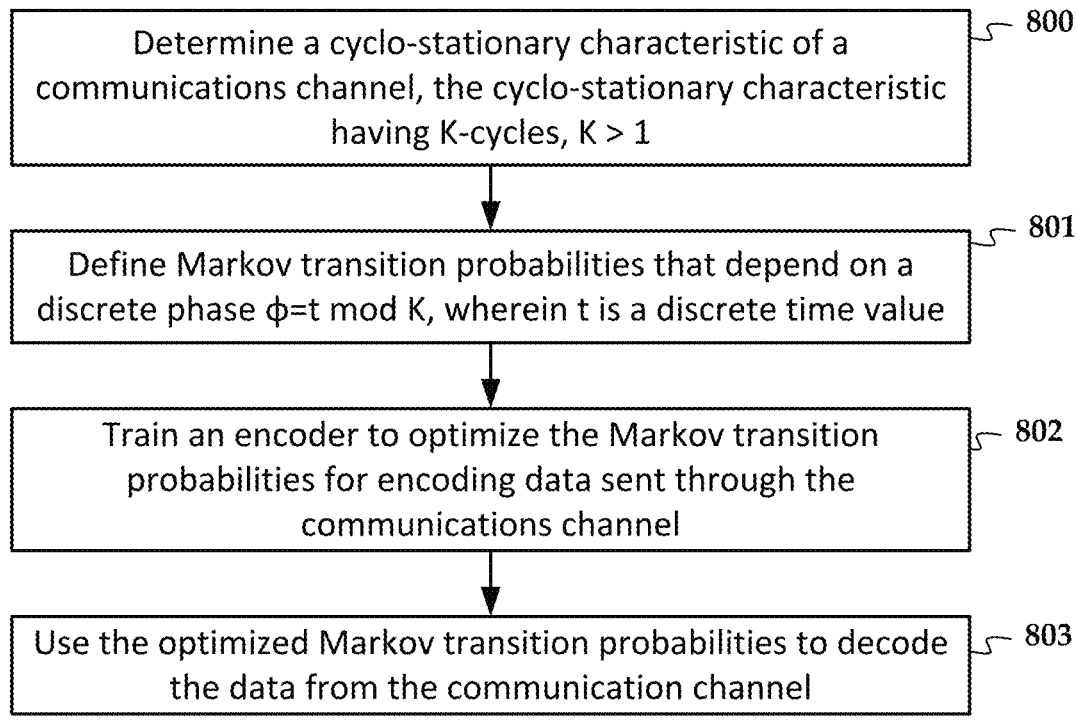
FIGS. 8 and 9 are flowcharts of methods according to example embodiments.

In FIG. 8, a flowchart illustrates a method according to an example embodiment. The method involves determining 800 a cyclo-stationary characteristic of a communications channel. Such characteristic may be already known/and/or may be determined through testing. The cyclo-stationary characteristic has K-cycles, where K>1. Markov transition probabilities are defined 801 that depend on a discrete phase ϕ=t mod K, wherein t is a discrete time value. An encoder is trained 802 to optimize the Markov transition probabilities for encoding data sent through the communications channel. The optimized Markov transition probabilities are used 803 to decode the data from the communication channel. Note that although the cyclo-stationary characteristic is associated with the communications channel (e.g., can be detected via the channel), the source of the cyclo-stationary behavior may originate elsewhere, e.g., at an endpoint of the channel such as a grain patterned recording media with a cyclo-stationary characteristic.

Figure 9:
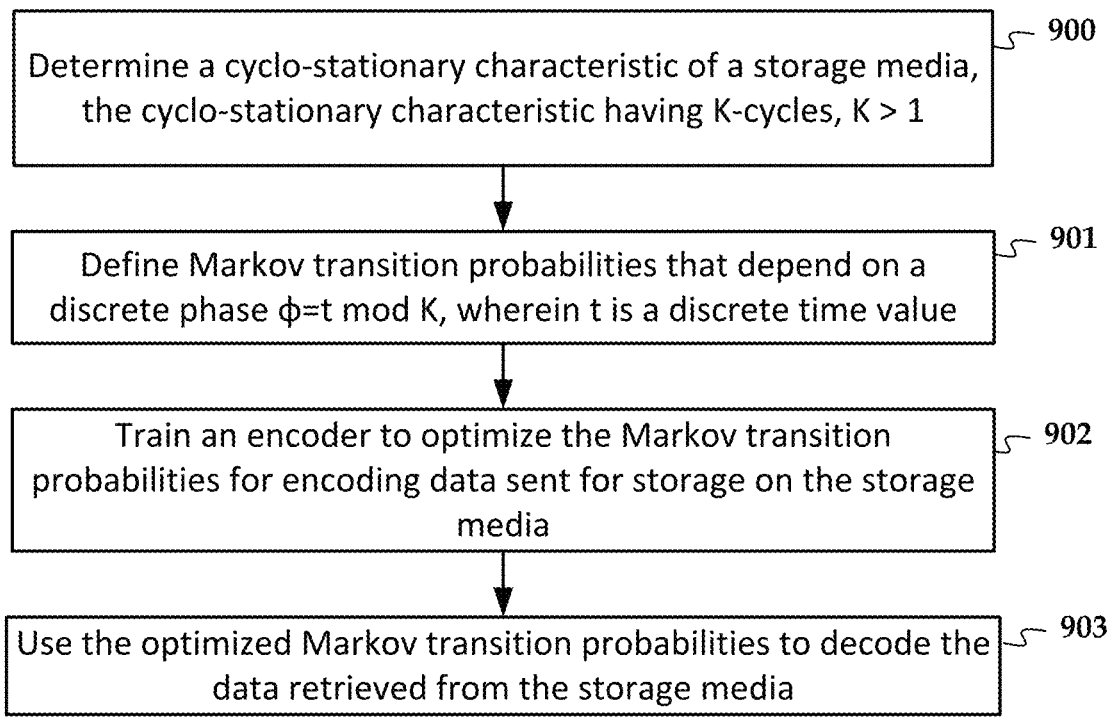

In FIG. 9, a flowchart illustrates a method according to another example embodiment. The method involves determining 900 a cyclo-stationary characteristic of a storage media. The cyclo-stationary characteristic has K-cycles, where K>1. Markov transition probabilities are defined 901 that depend on a discrete phase d)=t mod K, wherein t is a discrete time value. An encoder is trained 902 to optimize the Markov transition probabilities for encoding data sent for storage on the storage media. The optimized Markov transition probabilities are used 903 to decode the data retrieved from the storage media.

The various embodiments described above may be implemented using circuitry, firmware, and/or software modules that interact to provide particular results. One of skill in the arts can readily implement such described functionality, either at a modular level or as a whole, using knowledge generally known in the art. For example, the flowcharts and control diagrams illustrated herein may be used to create computer-readable instructions/code for execution by a processor. Such instructions may be stored on a non-transitory computer-readable medium and transferred to the processor for execution as is known in the art. The structures and procedures shown above are only a representative example of embodiments that can be used to provide the functions described hereinabove.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

What is claimed is:

1. A method, comprising:
   determining a cyclo-stationary signal and noise statistic of a communications channel, the cyclo-stationary signal and noise statistic having K-cycles, K>1;
   defining Markov transition probabilities that depend on a discrete phase ϕ=t mod K, wherein t is a discrete time value;
   training an encoder to optimize the Markov transition probabilities for encoding data sent through the communications channel; and
   using the optimized Markov transition probabilities to decode the data from the communications channel.

2. The method of claim 1, wherein in a soft output Viterbi algorithm (SOVA) decoder is used to decode the data from the communications channel, and wherein branch metrics of the SOVA decoder utilize the optimized Markov transition probabilities.

3. The method of claim 1, wherein the communications channel is a data storage channel, and the data is stored on a grain-patterned media.

4. The method of claim 3, wherein the cyclo-stationary signal and noise statistic is due to bit transitions recorded in K-grain rows of the grain-patterned media separated by pattern transition boundaries.

5. The method of claim 4, wherein each data segment of the grain-patterned media starts with a bit having a bit transition characteristic corresponding to a predetermined one of the K-cycles.

6. The method of claim 1, wherein training the encoder to optimize the Markov transition probabilities comprises:
   generating a training sequence as a Markov code;
   propagating the training sequence through the communications channel;

estimating, with a SOVA detector with branch metrics that utilize the Markov code, data values of the training sequence after propagation through the communications channel;

comparing the estimated data values to the generated training sequence to determine an error rate; and changing the training sequence as a different Markov code to lower the error rate of the data through the communications channel.

7. The method of claim 6, wherein generating the training sequence as the Markov code comprises mapping random data to sequences having the transition probabilities of the Markov code.

8. The method of claim 1, wherein the data is encoded and decoded in a block size of B-bits, where B is an integer multiple of K, such that a number of the optimized Markov transition probabilities is the same as with a stationary Markov model that encodes and decodes B-bit data blocks.

9. The method of claim 1, wherein the data is encoded and decoded in a block size of B-bits, where d is a greatest common denominator of B and K, such that a number of the optimized Markov transition probabilities correspond to K/d discrete phase values.

10. A data storage device comprising a controller configured to perform the method of claim 1, wherein the communications channel is used to perform one or both of storing and retrieving data to a storage media of the data storage device.

11. The data storage device of claim 10, wherein the storage media comprises a grain-patterned media.

12. A method, comprising:

determining a cyclo-stationary signal and noise statistic of a storage media, the cyclo-stationary signal and noise statistic having K-cycles, K>1;

defining Markov transition probabilities that depend on a discrete phase $\phi = t \bmod K$, wherein t is a discrete time value;

training an encoder to optimize the Markov transition probabilities for encoding data sent for storage on the storage media; and using the optimized Markov transition probabilities to decode the data retrieved from the storage media.

13. The method of claim 12, wherein in a soft output Viterbi algorithm (SOVA) decoder is used to decode the data from the storage media, and wherein branch metrics of the SOVA decoder utilize the optimized Markov transition probabilities.

14. The method of claim 12, wherein the storage media comprises a grain-patterned media.

15. The method of claim 14, wherein the cyclo-stationary signal and noise statistic is due to bit transitions recorded in K-grain rows of the grain-patterned media separated by pattern transition boundaries.

16. The method of claim 15, wherein each data segment of the grain-patterned media starts with a bit having a bit transition characteristic corresponding to a predetermined one of the K-cycles.

17. The method of claim 12, wherein training the encoder to optimize the Markov transition probabilities comprises:

mapping random data to sequences having the transition probabilities of a Markov code to generating a training sequence;

propagate the training sequence through a communication channel coupled to the storage media;

estimate, with a SOVA detector, data values of the training sequence after propagation through the communication channel;

compare the estimated data values to the generated training sequence to determine an error rate; and change the training sequence as a different Markov code to lower the error rate of the data through the communication channel.

18. The method of claim 12, wherein the data is encoded and decoded in a block size of B-bits, where B is an integer multiple of K, such that a number of the optimized Markov transition probabilities is the same as with a stationary Markov model that encodes and decodes B-bit data blocks.

19. The method of claim 12, wherein the data is encoded and decoded in a block size of B-bits, where d is a greatest common denominator of B and K, such that a number of the optimized Markov transition probabilities correspond to Kid discrete phase values.

20. A data storage device comprising the storage media of claim 12 and a controller configured to perform the method of claim 12, wherein the storage media comprises a grain-patterned media.

* * * * *